United States Patent
Roy

(10) Patent No.: US 9,590,127 B2
(45) Date of Patent: Mar. 7, 2017

(54) DUAL CONVERSION GAIN IMAGE SENSOR CELL

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 55 days.

(21) Appl. No.: 14/335,095

(22) Filed: Jul. 18, 2014

(65) Prior Publication Data

US 2015/0021459 A1    Jan. 22, 2015

(30) Foreign Application Priority Data

Jul. 18, 2013 (FR) ..................... 13 57064

(51) Int. Cl.
*H01L 27/00* (2006.01)
*H01L 31/103* (2006.01)
*H01L 27/146* (2006.01)
*H04N 5/378* (2011.01)

(52) U.S. Cl.
CPC ...... *H01L 31/103* (2013.01); *H01L 27/14612* (2013.01); *H01L 27/14643* (2013.01); *H04N 5/378* (2013.01)

(58) Field of Classification Search
CPC ............ H01L 27/14603; H04N 3/1568; H04N 5/3559; H04N 5/37452; H04N 5/378
See application file for complete search history.

(56) References Cited

U.S. PATENT DOCUMENTS

| 2004/0251394 A1* | 12/2004 | Rhodes | H01L 27/14603 250/208.1 |
| 2005/0224843 A1* | 10/2005 | Boemler | H01L 27/14603 257/233 |
| 2006/0044437 A1 | 3/2006 | Shah | |
| 2006/0181622 A1* | 8/2006 | Hong | H01L 27/14609 348/248 |
| 2011/0183709 A1 | 7/2011 | Roy | |
| 2012/0256077 A1* | 10/2012 | Yen | H01L 27/14609 250/208.1 |
| 2013/0001403 A1 | 1/2013 | Yamakawa | |

FOREIGN PATENT DOCUMENTS

FR    2971622 A1    8/2012

\* cited by examiner

*Primary Examiner* — Thanh Luu
(74) *Attorney, Agent, or Firm* — Seed IP Law Group LLP

(57) ABSTRACT

An image sensor cell formed inside and on top of a substrate of a first conductivity type, including: a read region of the second conductivity type; and, adjacent to the read region, a storage region of the first conductivity type topped with a first insulated gate electrode. The first electrode is arranged to receive, in a first operating mode, a first voltage causing the inversion of the conductivity type of the storage region, so that the storage region behaves as an extension of the read region, and, in a second operating mode, a second voltage causing no inversion of the storage region.

14 Claims, 2 Drawing Sheets

DUAL CONVERSION GAIN IMAGE SENSOR CELL

BACKGROUND

Technical Field

The present disclosure relates to image sensors, and more specifically to a CMOS sensor comprising pixels of dual charge-to-voltage conversion gain.

Description of the Related Art

Conventionally, a CMOS image sensor includes a plurality of pixels, each having a photodiode used in reverse mode, having its junction capacitance discharged by a photocurrent according to a received light intensity. At the end of a so-called integration period, before and after which the pixel is reset by recharging its photodiode, the photogenerated charges stored in the photodiode are transferred to a capacitive read node of the pixel. The measurement of the illumination level received by the pixel is performed by measuring the read node voltage.

The read node capacitance conditions the pixel sensitivity to illumination level variations. The lower the read node capacitance, the higher the charge-to-voltage conversion factor or gain of the pixel, in volts per electron, and conversely. Thus, a read node of low capacitance enables to relatively easily discriminate low illumination variations, especially in low illumination conditions, but may however be unable to receive all the charges photogenerated in the photodiode in case of a strong illumination. Conversely, a read node of high capacitance enables to measure high illumination levels, but does not enable to easily discriminate low illumination level variations, especially in low illumination conditions.

Image sensors where the capacitance of the read node of a pixel can be adjusted during the sensor operation have already been provided, which enables to adapt the charge-to-voltage conversion gain of the pixel, and thus its sensitivity and the extent of its dynamic range, according to the luminosity conditions.

It is however needed to improve certain aspects of existing sensors having an adjustable read capacitance.

BRIEF SUMMARY

One embodiment of the present disclosure provides an image sensor cell formed inside and on top of a substrate of a first conductivity type, comprising: a read region of the second conductivity type; and, adjacent to the read region, a storage region of the first conductivity type topped with a first insulated gate electrode, wherein the first electrode is arranged to receive, in a first operating mode, a first voltage causing the inversion of the conductivity type of the storage region, so that the storage region behaves as an extension of the read region and, in a second embodiment, a second voltage causing no inversion of the storage region.

According to an embodiment, in the second operating mode, the storage region contains no photogenerated charges.

According to an embodiment, the only region of the second conductivity type adjacent to said storage region is the read region.

According to an embodiment, the cell further comprises a photodiode comprising an accumulation region of the second conductivity type.

According to an embodiment, the accumulation region is separated from the read region by a transfer region of the first conductivity type topped with a second insulated gate electrode.

According to an embodiment, the accumulation region and the read region coincide or are adjacent.

According to an embodiment, the cell further comprises a reset transistor coupling the read region to a node of application of a reset voltage.

According to an embodiment, the cell further comprises a read stage coupling the read region to a track coming out of the cell.

Another embodiment provides an image sensor comprising a plurality of cells of the above-mentioned type.

Another embodiment provides a method for reading a cell, comprising the successive steps of: resetting the voltage of the read region; applying the first voltage to the first electrode and controlling the second electrode to transfer photogenerated charges from the accumulation region to the read region; and applying the second voltage to the first electrode and reading the voltage of the read region.

The foregoing and other features and advantages will be discussed in detail in the following non-limiting description of specific embodiments in connection with the accompanying drawings.

DETAILED DESCRIPTION

Figure 1:
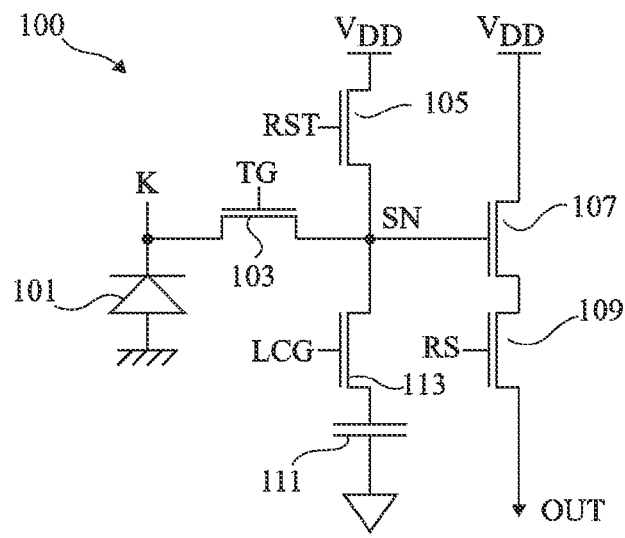
FIG. 1 shows an electric diagram of an example of pixel having an adjustable read capacitance.

For clarity, the same elements have been designated with the same reference numerals in the different drawings and, further, as usual in the representation of integrated circuits, the various drawings are not to scale. Further, in the following description, unless otherwise indicated, terms "approximately", "substantially", "around", and "on the order of" mean "to within 10%", and terms referring to directions, such as overhanging, covering, topping, lateral, above, under, etc., apply to circuits arranged as illustrated in the cross-section views of the corresponding drawings.

FIG. 1 illustrates an electric diagram of an example of a pixel 100 having a dual charge-to-voltage conversion gain. Pixel 100 comprises a photodiode 101 having its anode connected to a node or rail of application of a low voltage GND, generally the ground, and having its cathode K, or accumulation node, coupled, via a transfer transistor 103, to a sense node SN. Sense node SN is coupled by a reset transistor 105 to a node or rail of application of a high voltage $V_{DD}$. Sense node SN is further coupled to a track OUT coming out of the pixel via a read stage. In this example, the read stage comprises a transistor 107 assembled as a follower source, having its gate connected to sense node SN. The drain of transistor 107 is connected to a node or rail of application of a high voltage, voltage $V_{DD}$ in this example, and the source of transistor 107 is coupled, by a read transistor 109, to track OUT coming out of the pixel. To enable to adjust the charge-to-voltage conversion gain of the pixel, sense node SN is further coupled to an additional storage capacitance 111 via a gain control transistor 113.

In the shown example, transistors 103, 105, 107, 109, and 113 of pixel 100 are N-channel MOS transistors. Capacitance 111 of pixel 100 for example is a metal—insulator—metal capacitance, or a polysilicon—insulator—polysilicon capacitance.

In operation, pixel 100 receives control signals TG, RST, RS, and LCG respectively applied to the gates of transistors 103, 105, 109, and 113.

During a pixel initialization phase, transistor 105 may be turned on (signal RST in a high state in this example), which causes the initialization of the voltage of node SN to the voltage of node $V_{DD}$. Transistor 103 can then be turned on (signal TG in a high state in this example), which causes the transfer of all the charges stored in photodiode 101 to sense node SN. The voltage across photodiode 101 then becomes equal to the natural voltage of the diode, which results from the doping levels.

During a pixel integration phase, following an initialization phase, transfer transistor 103 may be maintained off (signal TG in the low state in this example) to isolate acquisition node K from sense node SN. The electric charges generated in photodiode 101 under the effect of light then cause a progressive decrease of the potential of acquisition node K.

During a pixel read phase, at the end of an integration phase, reset transistor 105 may be off (signal RST in the low state in this example), to isolate sensor node SN from reset voltage $V_{DD}$. Transistor 103 can then be turned on (signal TG in the high state in this example), which causes the transfer to sense node SN of the photogenerated charges stored at node K. The voltage of node K can then be read from output track OUT via transistors 107 and 109. For this purpose, transistor 109 can then be turned on (signal RS in a high state in this example).

If the illumination level received by the pixel with a low charge-to-voltage conversion gain is desired to be measured, for example, in the case of a strong illumination, it may be provided to turn on transistor 113 (signal LCG in a high state in this example) during the pixel read phase. The charge storage capacitance of sense node SN is then increased by capacitance 111, and node SN can receive a relatively high quantity of photogenerated charges before being saturated. If, however, the illumination level received by the pixel with a high charge-to-voltage conversion gain is desired to be measured, for example, in the case of a low lighting, it may be provided to maintain transistor 113 off (signal LCG in a low state in this example) to isolate node SN from capacitance 111.

A disadvantage of pixel 100 is that, as compared with a conventional pixel having a fixed read capacitance, it comprises an additional MOS transistor (transistor 113) and an additional capacitance (capacitance 111). These elements significantly increase the pixel size.

Further, the presence of transistor 113 and of capacitance 111 may cause an additional reset noise capable of altering the quality of the obtained image.

Figure 2:
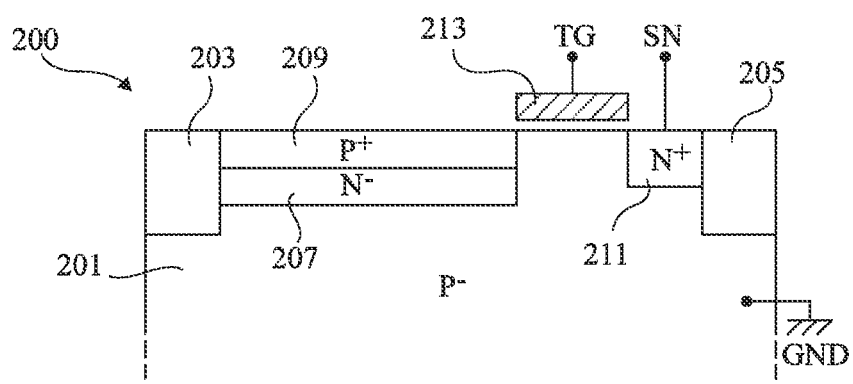
FIG. 2 is a partial simplified cross-section view of an example of a CMOS image sensor pixel.

FIG. 2 is a partial simplified cross-section view of an example of a CMOS image sensor pixel 200. In FIG. 2, only certain elements of pixel 200 have been shown, that is, a photodiode, a transfer transistor, and a sense node.

As shown in the drawing, these elements are formed inside and on top of a region of a P-type doped semiconductor substrate 201, for example, a silicon substrate, delimited by insulating trenches 203, 205, for example, made of silicon oxide.

The photodiode is formed close to the surface of substrate 201, and comprises an N-doped region 207 topped with a P-type region 209. In this example, N-type region 207 is totally surrounded either with P-type regions (substrate 201 and region 209 in the shown example) or with insulator (trench 203 in the shown example). Region 207 defines a photogenerated charge accumulation area. The photodiode of pixel 200 is a so-called pinned photodiode. In the absence of photogenerated charges, the voltage of accumulation region 207 is defined by the doping levels of regions 207, 209, and 201.

During a sensor integration phase, charges resulting from the pixel being hit by light are stored in region 207. Such charges (electrons in this example, accumulation region 207 being of type N) are then transferred, during a transfer phase, from region 207 to an N-type doped read region 211, via a transfer transistor. The transfer transistor comprises an insulated gate stack 213 formed on the surface of P-type substrate 201, between region 209 and region 211. During a transfer, charges leave region 207 from its side coinciding, in top view, with an edge of gate 213, and are transferred into read region 211, through a channel generated in substrate region 201 located under gate 213 or transfer region, by applying a transfer voltage TG to gate electrode 213. In this example, the lateral and lower surfaces of read region 211 are entirely surrounded either with P-type regions (substrate 201 in the shown example), or with insulator (trench 205 in the shown example). The upper surface of read region 211, emerging at the surface of the substrate, may be coated with a contact metallization, not shown, from which the voltage of sense node SN can be read.

Pixel 200 may comprise other elements than those shown in FIG. 2. As an example, in the case of a pixel of the type described in relation with FIG. 1, pixel 200 may further comprise a reset transistor coupling sense node SN to a node of application of a reset voltage, a read stage coupling sense node SN to an output track of the pixel, an additional charge storage capacitor, and a gain control transistor coupling the sense node to the additional capacitor.

Figure 3:
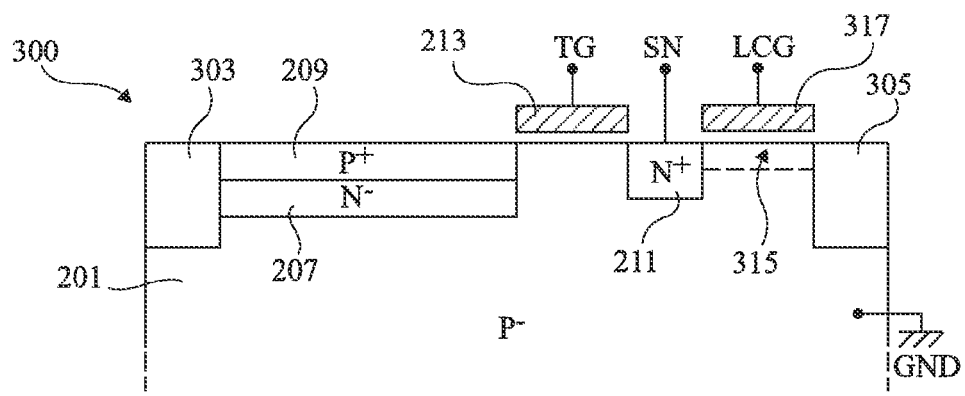
FIG. 3 is a partial simplified cross-section view of an embodiment of a pixel having an adjustable read capacitance.

FIG. 3 is a partial simplified cross-section view of an embodiment of a pixel 300 of dual charge-to-voltage conversion gain. In FIG. 3, only certain elements of pixel 300 have been shown, that is, a photodiode, a transfer transistor, a sense node, and an element for adjusting the sense node capacitance.

As shown in FIG. 3, these elements are formed inside and on top of a region of a P-type doped semiconductor substrate 201, for example, a silicon substrate, delimited by insulating trenches 303, 305, for example, made of silicon oxide. In the example of FIG. 3, the photodiode, the transfer transistor, and the read region comprise substantially the same elements, substantially arranged in the same way as in the example of FIG. 2. In particular, the photodiode is formed close to the surface of substrate 201, and comprises an N-type doped region 207 topped with a P-type doped region 209. In this example, region 207 is entirely surrounded either with P-type regions (substrate 201 and region 209 in the shown example), or with insulator (trench 303 in the shown example). During a sensor integration phase, charges resulting from the pixel being hit by light are stored in region 207. Such charges are then transferred, during a transfer phase, from region 207 to an N-type doped read region 211, via a transfer transistor comprising an insulated gate stack 213 formed on the surface of P-type substrate 201, between region 209 and region 211. In this example, the charge transfer from accumulation region 207 to read region 211 is performed substantially in the same way as in the example of FIG. 2. In this example, the lateral and lower surfaces of read region 211 are entirely surrounded with P-type regions (substrate 201 in the shown example). The upper surface of read region 211, emerging at the surface of the substrate, may be coated with a contact metallization, not shown, from which the voltage of sense node SN can be read.

According to an aspect of the embodiment of FIG. 3, pixel 300 further comprises, adjacent to read region 211, a P-type storage region 315 topped with an insulated gate stack 317. Storage region 315 is arranged in an upper portion of substrate 201 and forms with insulated gate 317 a MOS capacitance. The gate electrode of stack 317 is for example made of metal or of polysilicon and receives, in operation, a control signal LCG. As an example, read region 211 has, in top view, an approximately rectangular shape, and storage region 315 is adjacent to an edge of region 211 opposite to transfer gate 213. In this example, the only N-type region adjacent to storage region 315 is read region 211, the other edges of storage region 315 being surrounded either with P-type regions (substrate 201 in the shown example), or with insulator regions (trench 305 in this example).

In pixel 300, the assembly formed by insulated gate 317 and storage region 315 is provided to operate according to two modes.

In a first operating mode, the level of signal LCG applied to gate 317 is such that P-type storage region 315 inverts, that is, electrons become, in this region, the majority charge carriers. Storage region 315 then behaves as an N-type region, and forms an extension of read region 211. In this first operating mode, if photogenerated charges (electrons) are transferred from accumulation region 207 to read region 211 via the transfer transistor, these charges distribute in read region 213 and in storage region 315, since the PN junction formed between region 211 and region 315 is not blocking for these charges. In other words, in the first operating mode, region 315 is capable of storing photogenerated charges, and the charge storage capacitance of region 315 adds to the charge storage capacitance of read region 211. This results in a decrease of the charge-to-voltage conversion gain of the pixel with respect to a pixel of the type described in relation with FIG. 2.

In a second operating mode, signal LCG applied to gate 317 is such that P-type storage region 315 does not invert, that is, electrons remains by a minority with respect to holes in this region. In this second operating mode, if photogenerated charges (electrons) are transferred from accumulation region 207 to read region 211 via transfer transistor, these charges remain confined in read region 211, since the PN junction between region 211 and region 315 is blocking for these charges. The capacitance of the pixel sense node is then lower than in the first operating mode, which provides a higher charge-to-voltage conversion gain. In this second operating mode, storage region 315 is entirely depleted of photogenerated charges, these charges being possibly repulsed towards read region 211. In the second operating mode, the capacitance of sense node SN and the charge-to-voltage conversion gain of the pixel are substantially the same as in the example of FIG. 2.

It should be noted that, as appears from the above explanations, in pixel 300, the assembly formed by storage region 315 and overhanging insulated gate 317 does not have the function of transferring photogenerated charges from one region to another, but only to store photogenerated charges under gate 317 in the first operating mode.

It will be within the abilities of those skilled in the art to select suitable doping levels and control voltage levels to obtain the two above-mentioned operating modes. The doping level ($N^+$) of read region 211 is preferably greater than the doping level ($N^-$) of accumulation region 207, the doping level ($P^+$) of region 209 is preferably greater than the doping level ($P^-$) of substrate 201, and the doping level of storage region 315 is preferably greater than or equal to the doping level of substrate 201.

As a non-limiting example, the doping levels of substrate 201, of accumulation region 207, of P-type region 209, and of sense node 211 may range between respectively $5*10^{14}$ and $5*10^{15}$ atoms/cm$^3$, $5*10^{16}$ and $5*10^{17}$ atoms/cm$^3$, $10^{17}$ and $5*10^{18}$ atoms/cm$^3$, and $10^{18}$ and $10^{19}$ atoms/cm$^3$, and the doping level of storage region 315 may be the same as that of substrate 201.

The voltage applied to gate 317 (signal LCG) may be strictly positive, for example, on the order of 3.3 V, in the first operating mode, and smaller than or equal to 0 V, for example, on the order of −0.8 V, in the second operating mode. As an example, the voltage applied to gate 213 of the transfer transistor (signal TG) may be strictly positive, for example, on the order of 3.3 V, when the transfer transistor is desired to be turned on, and smaller than or equal to 0 V, for example, on the order of −0.8 V when the transfer transistor is desired to be made non-conductive.

Pixel 300 may comprise other elements than those shown in FIG. 3, for example, a reset transistor coupling sense node SN to a node of application of a reset voltage and/or a read stage coupling sense node SN to an output track of the pixel—for example, a read stage of the type described in relation with FIG. 1.

Figure 4A:
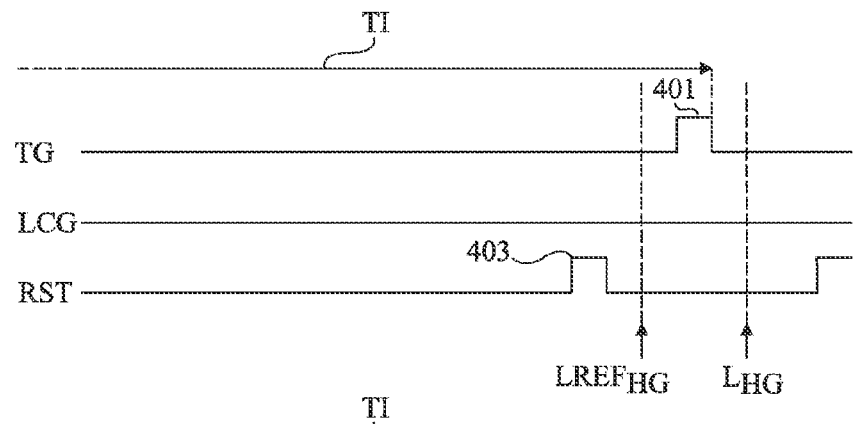
FIGS. 4A to 4D are timing diagrams illustrating examples of a method for controlling a pixel of adjustable read capacitance of the type described in relation with FIG. 3.
Figure 4B:
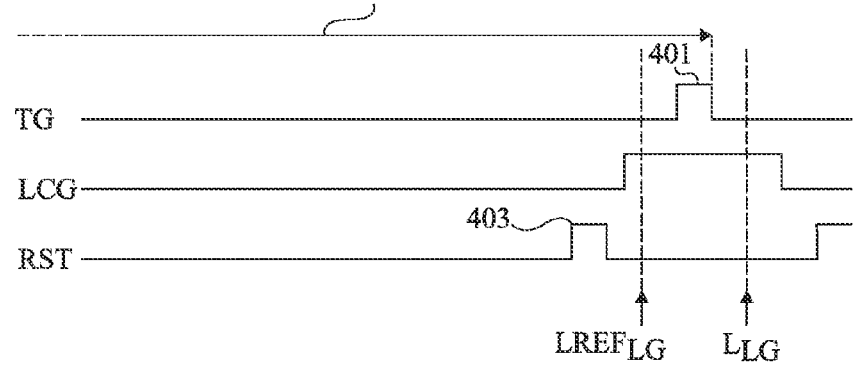
Figure 4C:
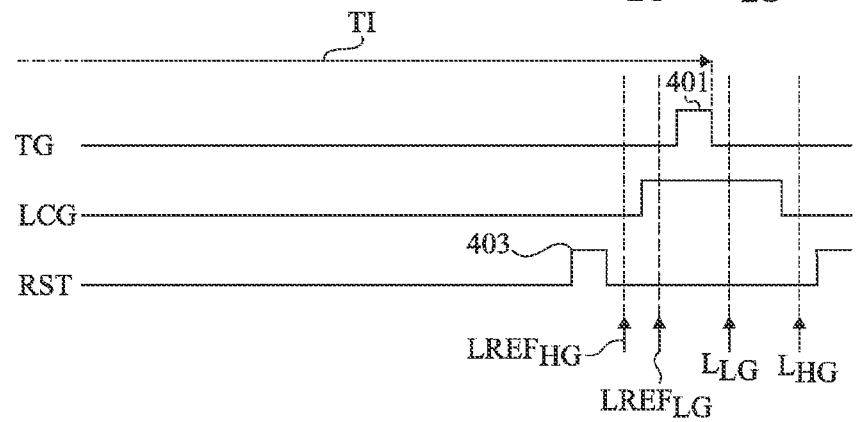
Figure 4D:
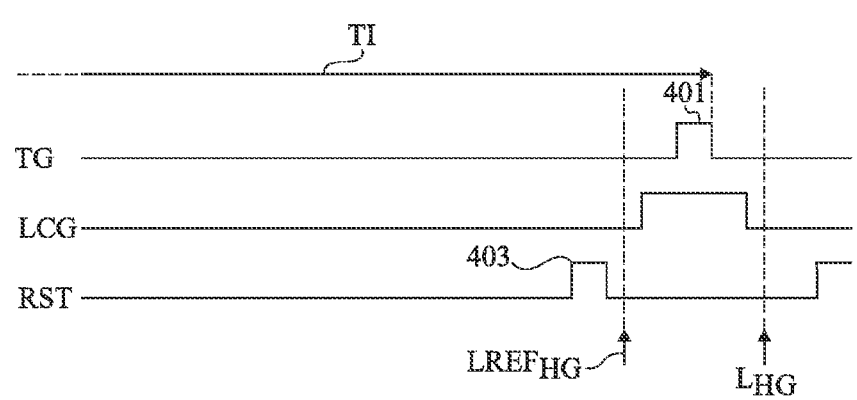

FIGS. 4A and 4D are timing diagrams respectively illustrating four examples of a method for controlling a pixel of adjustable read capacitance of the type described in relation with FIG. 3. FIGS. 4A to 4D more specifically illustrate examples of a pixel control method during a pixel read phase, at the end of an integration phase TI. Each of FIGS. 4A to 4D shows the time variation of control signals TG, LCG, and RST respectively applied to gate 213 of the pixel transfer transistor, to gate 317 of the element for adjusting the pixel capacitance, and to the gate of a reset transistor (not shown) of the pixel coupling sense node SN to a node of application of a reset voltage.

During pixel integration phase TI (only partially shown in FIGS. 4A to 4D), the transfer transistor is maintained off to isolate accumulation region 207 from read region 211. To achieve this, signal TG is maintained in a low state. Photogenerated electric charges are then stored in accumulation region 207 of the pixel.

At the end of integration phase TI, the transfer transistor is turned on to transfer the photogenerated charges stored in region 207 onto the sense node. To achieve this, signal TG may be set to a high state for a pulse 401, the end of a pulse 401 marking the end of integration period TI.

Before pulse 401, and thus before the transfer of the photogenerated charges to sense node SN, the voltage of node SN of the pixel is reset. To achieve this, signal RST is set to a high state, for example, for a pulse 403, to turn on the reset transistor and then set back to a low state, to isolate node SN from the reset voltage.

The actual pixel read phase starts between the end of reset pulse 403 and the beginning of transfer pulse 401, and ends after the end of transfer pulse 401.

FIG. 4A illustrates an example of a read method where the pixel is read with a high charge-to-voltage conversion gain.

In this example, signal LCG is maintained in a low state during the entire read phase, that is, storage region 315 is not inverted, and thus does not take part in the conversion into voltage of the photogenerated charges stored in the photodiode during the integration.

Between the end of reset pulse 403 and the beginning of transfer pulse 401, the voltage of sense node SN is read, as illustrated by arrow $LREF_{HG}$. This voltage is stored, for example, in a capacitor of a read stage external to the pixel (not shown) and forms a reference for a subsequent step of measurement of the quantity of photogenerated charges stored in the photodiode during the integration.

After the end of transfer pulse 401, the voltage of sense node SN is read again, as illustrated by arrow $L_{HG}$.

The output value of the pixel is for example equal to the difference between the reference voltage read at step $LREF_{HG}$ and the voltage read at step $L_{HG}$. This value is indeed representative of the quantity of photogenerated charges transferred onto the pixel sense node during pulse 401.

After second reading $L_{HG}$, the pixel may be reset for a new integration phase.

FIG. 4B illustrates an example of a read method where the pixel is read with a low charge-to-voltage conversion gain.

In this example, after the end of reset pulse 403, signal LCG is set to a high state, and remains in a high state until the end of the read phase. Storage region 315 is then active, that is, capable of containing photogenerated charges, and thus takes part in the conversion into voltage of the photogenerated charges stored in the photodiode during the integration.

After the setting to the high state of signal LCG and before the beginning of transfer pulse 401, the voltage of sense node SN is read, as illustrated by arrow $LREF_{LG}$. This voltage is stored and forms a reference for a subsequent step of measurement of the quantity of photogenerated charges stored in the photodiode during the integration.

After the end of transfer pulse 401, and while signal LCG still is in the high state, the voltage of sense node SN is read again, as illustrated by arrow $L_{LG}$. The output value of the pixel is for example equal to the difference between the reference voltage read at step $LREF_{LG}$ and the voltage read at step $L_{LG}$.

After second reading $L_{LG}$, signal LCG may be set back to a low state, after which the pixel may be reset for a new integration phase.

FIG. 4C illustrates an example of a read method where two pixel values are read at the end of a same integration phase, one with a high charge-to-voltage conversion gain and the other with a low charge-to-voltage conversion gain.

In this example, between the end of reset pulse 403 and the beginning of transfer pulse 401, the voltage of sense node SN is read, as illustrated by arrow $LREF_{HG}$ while signal LCG is in a low state. This voltage is stored and forms a reference for a subsequent step of measurement of the quantity of photo-generated charges stored in the photodiode during the integration.

After read step $LREF_{HG}$, signal LCG is set to a high state to increase the charge storage capacitance of sense node SN.

After the setting to the high state of signal LCG and before the beginning of transfer pulse 401, the voltage of sense node SN is read again, as illustrated by arrow $LREF_{LG}$. This voltage is stored, and forms a reference for a subsequent step of measurement of the quantity of photogenerated charges stored in the photodiode during the integration.

After the end of transfer pulse 401, and while the voltage of node LCG still is in the high state, the voltage of node SN is read again, as illustrated by arrow $L_{LG}$.

A first output value of the pixel, corresponding to a reading at a low charge-to-voltage conversion gain (storage region 315 activated), is for example equal to the difference between the reference voltage read at step $LREF_{LG}$ and the voltage read at step $L_{LG}$.

After read step $L_{LG}$, signal LCG is set back to a low state, after which the voltage of node SN is read again, as illustrated by arrow $L_{HG}$.

A second output value of the pixel, corresponding to a reading at a high charge-to-voltage conversion gain (storage region 315 deactivated), is for example equal to the difference between the reference voltage read at step $LREF_{HG}$ and the voltage read at step $L_{HG}$.

After the fourth reading $L_{HG}$, the pixel may be reset for a new integration phase.

FIG. 4D illustrates another example of a read method where the pixel is read with a high charge-to-voltage conversion gain.

In this example, between the end of reset pulse 403 and the beginning of transfer pulse 401, the voltage of sense node SN is read, as illustrated by arrow $LREF_{HG}$, while signal LCG is in a low state. This voltage is stored and forms a reference for a subsequent step of measurement of the quantity of photogenerated charges stored in the photodiode during the integration.

After read step $LREF_{HG}$, signal LCG is set to a high state, which amounts to activating charge storage region 315. This especially results in increasing the voltage of sense node SN.

The transfer onto sense node SN of the charges stored in the photodiode during the integration (pulse 401) is then performed while signal LCG is in the high state. The transferred charges thus distribute in read region 211 and in storage region 315.

After the end of the transfer, signal LCG is set back to the low state, whereby all the photogenerated charges located in storage region 315 are taken back to read region 211. The voltage of sense node SN is then read again, as illustrated by arrow $L_{HG}$. The output value of the pixel is for example equal to the difference between the reference voltage read at step $LREF_{HG}$ and the voltage read at step $L_{HG}$.

After second reading $L_{HG}$, the pixel may be reset for a new integration phase.

As compared with the control method of FIG. 4A, the method of FIG. 4D has the advantage of easing the charge transfer from accumulation region 207 to sense node SN, due to the voltage increase of node SN during the transfer, which results from the activation of storage region 315.

An advantage of the pixel structure described in relation with FIG. 3 is that it provides a dual charge-to-voltage conversion gain, while having a decreased bulk with respect to existing dual conversion gain structures.

Another advantage of this structure is that it enables to obtain a dual charge-to-voltage conversion gain without introducing any additional reset noise with respect to a pixel of fixed conversion gain of the type described in relation with FIG. 2.

Specific embodiments have been described. Various alterations, modifications, and improvements will readily occur to those skilled in the art.

In particular, an embodiment of a pixel of dual charge-to-voltage conversion gain where the photodiode is a planar-type pinned diode, that is, a diode where the accumulation region is located close to the substrate surface, and extends substantially horizontally in the substrate, across a small thickness, the transfer gate being located next to the accumulation region in top view, been described hereinabove. It will be within the abilities of those skilled in the art to obtain the desired operation in pixels comprising other types of photodiodes, for example, vertical photodiodes, where the accumulation region extends in depth in the substrate, the transfer gate being capable of being located either next to (in top view) or under the accumulation region.

Further, the described embodiments are not limited to the above-mentioned examples where the charge accumulation region of the photodiode is separated from the read region by a transfer gate. It will be within the abilities of those skilled in the art to obtain the operation in pixels of the type currently called "3T" in the art, where the accumulation region and the read region are one or directly in contact with each other.

Further, the described embodiments are not limited to the above-mentioned examples where the accumulation and read regions are of type N. It will be within the abilities of those skilled in the art to obtain the desired operation by inverting all conductivity types with respect to the above-mentioned examples, and by accordingly adapting the voltages of the various pixel control signals.

Further, the described embodiments are not limited to the examples of operation described in relation with FIGS. 4A to 4D. More generally, the pixel of FIG. 3 is compatible with all known methods for controlling a pixel of adjustable read capacitance.

Such alterations, modifications, and improvements are intended to be part of this disclosure, and are intended to be within the spirit and the scope of the present invention. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An image sensor cell, comprising:
a read region formed in a semiconductor substrate of a first conductively type, the read region being of a second conductivity type;
a photodiode that includes an accumulation region of the second conductivity type in the semiconductor substrate;
a transfer region of the semiconductor substrate separating the read region from the accumulation region;
a storage region of the first conductivity type adjacent to the read region;
a first insulated gate electrode formed on top of the storage region;
a second insulated gate electrode formed on top of the transfer region;
wherein said first insulated gate electrode is arranged to receive, in a first operating mode, a first voltage sufficient to cause an inversion of the conductivity type of the storage region and cause the storage region to behave as an extension of the read region, and, in a second operating mode, a second voltage insufficient to cause inversion of the storage region;
wherein the read region is configured to be charged to a voltage responsive to a reset signal and, after termination of the reset signal, the second insulated gate electrode is configured to receive an active transfer signal that causes inversion of the transfer region so that photogenerated charges in the accumulation region are transferred from the accumulation region through the transfer region to the read region and to the storage region responsive to the first insulated gate electrode receiving the first voltage and are transferred from the accumulation region through the transfer region to the read region responsive to the first insulated gate electrode receiving the second voltage;
wherein an output signal from the image sensor cell is based on the voltage on the read region after termination of the reset signal and prior to receiving the active transfer signal, and wherein the output signal is further based on a voltage on the read region after termination of the active transfer signal and while either the first voltage or the second voltage is received on the first insulated gate electrode;
wherein the output signal is further based on a first value of the voltage on the read region after termination of the reset signal and prior to receiving the active transfer signal when the second voltage is received on the first insulated gate electrode and is based on a second value of the voltage on the read region after termination of the reset signal and prior to receiving the active transfer signal when the first voltage is received on the first insulated gate electrode; and
wherein the output signal is further based on a first voltage on the read region after termination of the active transfer signal and while the first voltage is received on the first insulated gate electrode and the output signal is based on a second voltage on the read region after termination of the active transfer signal and while the second voltage is received on the first insulated gate electrode.

2. The image sensor cell of claim 1, wherein the second voltage is such that, in the second operating mode, the storage region contains no photogenerated charges.

3. The image sensor cell of claim 1, wherein the only region of the second conductivity type immediately adjacent to said storage region is the read region.

4. The image sensor cell of claim 1, wherein the accumulation region and the read region coincide with each other or are adjacent to each other.

5. The image sensor cell of claim 1, further comprising a reset transistor coupling the read region to a node configured to read a reset voltage.

6. The image sensor cell of claim 1, further comprising:
an output track; and
a read stage coupling the read region to the output track.

7. An image sensor, comprising:
a plurality of image sensor cells, each image sensor cell including:
a read region formed in a semiconductor substrate of a first conductively type, the read region being of a second conductivity type;
a photodiode that includes an accumulation region of the second conductivity type in the semiconductor substrate;
a transfer region of the semiconductor substrate separating the read region from the accumulation region;
a storage region of the first conductivity type adjacent to the read region; and a first insulated gate electrode formed on top of the storage region;

a second insulated gate electrode formed on top of the transfer region;

wherein said first insulated gate electrode is arranged to receive, in a first operating mode, a first voltage sufficient to cause an inversion of the conductivity type of the storage region and cause the storage region to behave as an extension of the read region, and, in a second operating mode, a second voltage insufficient to cause inversion of the storage region;

wherein the read region is configured to be charged to a voltage responsive to a reset pulse and, after termination of the reset pulse, the second insulated gate electrode is configured to receive a transfer pulse that causes inversion of the transfer region so that photo-generated charges in the accumulation region are transferred from the accumulation region through the transfer region to the read region and to the storage region responsive to the first insulated gate electrode receiving the first voltage and are transferred from the accumulation region through the transfer region to the read region responsive to the first insulated gate electrode receiving the second voltage;

wherein an output signal from the image sensor cell is based on the voltage on the read region after termination of the reset pulse and prior to receiving the transfer pulse, and wherein the output signal is further based on a voltage on the read region after termination of the transfer pulse and while either the first voltage or the second voltage is received on the first insulated gate electrode;

wherein the output signal from the image sensor cell is based on the voltage that is sensed on the read region after termination of the reset pulse and prior to receiving the transfer pulse while the second voltage is received on the first insulated gate electrode and wherein the output signal is further based on the voltage on the read region that is sensed after termination of the transfer pulse and while the second voltage is received on the first insulated gate electrode; and wherein the first voltage is received on the first insulated gate electrode between the sensing of the voltage on the read region prior to receiving the transfer pulse and the sensing of the voltage on the read region after the termination of the transfer pulse.

8. The image sensor of claim 7, wherein the second voltage is such that, in the second operating mode, the storage region contains no photogenerated charges.

9. The image sensor of claim 7, wherein the only region of the second conductivity type immediately adjacent to said storage region is the read region.

10. The image sensor of claim 7, wherein the accumulation region and the read region of each cell coincide with each other or are adjacent to each other.

11. The image sensor of claim 7, wherein each cell includes a reset transistor coupling the read region of the cell to a node configured to read a reset voltage.

12. The image sensor of claim 7, wherein each cell includes:

an output track; and a read stage coupling the read region of the cell to the output track.

13. A method, comprising:

resetting a voltage of a read region of an image sensor cell that includes a storage region of a first conductivity type adjacent to the read region and a first insulated gate electrode formed on top of the storage region, the read region and storage region being formed in a semiconductor substrate of the first conductivity type, the read region being of a second conductivity type;

sensing a reference voltage of the read region after the resetting;

transferring photogenerated charge in an accumulation region of the second conductivity type in the semiconductor substrate to the read region after sensing the reference voltage;

isolating the accumulation region from the read region to terminate the transfer of photogenerated charge from the accumulation region to the read region;

sensing a voltage of the read region after the transferring;

applying a first voltage to said first insulated gate electrode in a first operating mode, the applying the first voltage causing an inversion of the conductivity type of the storage region and causing the storage region to behave as an extension of the read region;

applying a second voltage to said first insulated gate electrode in a second operating mode, the second voltage being insufficient to cause inversion of the storage region;

generating an output signal based upon the reference voltage, the voltage on the read region after isolating the accumulation region from the read region, and the first or second voltage applied to the first insulated gate electrode;

wherein sensing the reference voltage of the read region after the resetting includes sensing the reference voltage when the second voltage is applied to the first insulated gate electrode;

wherein sensing the voltage of the read region after the transferring includes sensing the voltage when the second voltage is applied to the first insulated gate electrode; and applying the first voltage to the first insulated gate electrode between sensing the reference voltage and sensing the voltage of the read region.

14. The method of claim 13, wherein the cell includes a transfer region of the first conductivity type separating the read region from the accumulation region through which the photogenerated charges are transferred from the accumulation region to the read region, and a second insulated gate electrode positioned on the transfer region, and wherein transferring photogenerated charge in an accumulation region to the read region comprises controlling said second insulated gate electrode to transfer photogenerated charges from the accumulation region to the read region prior to sensing the voltage of the read region and wherein isolating the accumulation region from the read region comprises controlling said second insulated gate electrode to terminate the transfer of photogenerated charges from the accumulation region to the read region.

* * * * *